US008116709B2

United States Patent
Briand et al.

(10) Patent No.: US 8,116,709 B2
(45) Date of Patent: Feb. 14, 2012

(54) FREQUENCY MEASURING BROADBAND DIGITAL RECEIVER

(75) Inventors: Thierry Briand, Croissy sur Seine (FR); Gilles Guerbeur, Chaville (FR)

(73) Assignee: Thales, Neuilly Sur Seine (FR)

( * ) Notice: Subject to any disclaimer, the term of this patent is extended or adjusted under 35 U.S.C. 154(b) by 524 days.

(21) Appl. No.: 12/278,300

(22) PCT Filed: Jan. 22, 2007

(86) PCT No.: PCT/EP2007/050608
§ 371 (c)(1),
(2), (4) Date: Feb. 6, 2009

(87) PCT Pub. No.: WO2007/090730
PCT Pub. Date: Aug. 16, 2007

(65) Prior Publication Data
US 2010/0069030 A1    Mar. 18, 2010

(30) Foreign Application Priority Data

Feb. 10, 2006  (FR) ...................... 06 01205

(51) Int. Cl.
*H04B 17/00* (2006.01)
(52) U.S. Cl. .................. 455/226.1; 455/205; 342/13
(58) Field of Classification Search .................. 342/13; 455/205, 226.1
See application file for complete search history.

(56) References Cited

U.S. PATENT DOCUMENTS

| 6,448,921 B1 | 9/2002 | Tsui et al. |
| 6,690,315 B1 | 2/2004 | Schamus et al. |
| 7,482,967 B2 * | 1/2009 | Beharrell .................. 342/20 |

FOREIGN PATENT DOCUMENTS

| FR | 2695730 | 3/1994 |
| WO | 2004/097450 A | 11/2004 |

* cited by examiner

*Primary Examiner* — Lincoln Donovan
*Assistant Examiner* — William Hernandez
(74) *Attorney, Agent, or Firm* — Stroock & Stroock & Lavan LLP

(57) ABSTRACT

A microwave receiver measures the frequency F of a microwave signal in a band of frequencies whose maximum frequency is Fmax. The receiver has N frequency measuring digital stages E1, E2, ... Ek, ... EN providing N ambiguous frequency measurements Fm1, Fm2, ... Fmk, ... FmN of the signal received, the signal received being sampled, in each digital stage, at a respective sampling frequency Fe1, Fe2, ... Fek, ... FeN. The receiver further includes an ambiguity resolving device (40) receiving the N frequency measurements and providing the frequency F of the signal received. Each frequency measuring digital stage Ek has a one-bit analog/digital converter (50) fed directly with the microwave signal received by the receiver, means for performing a discrete Fourier transform on the basis of the samples output by the one-bit converter, and at least one detector (60, 62) of spectral line maximum of the discrete Fourier transform providing a frequency measurement Fmk of the signal received.

23 Claims, 3 Drawing Sheets

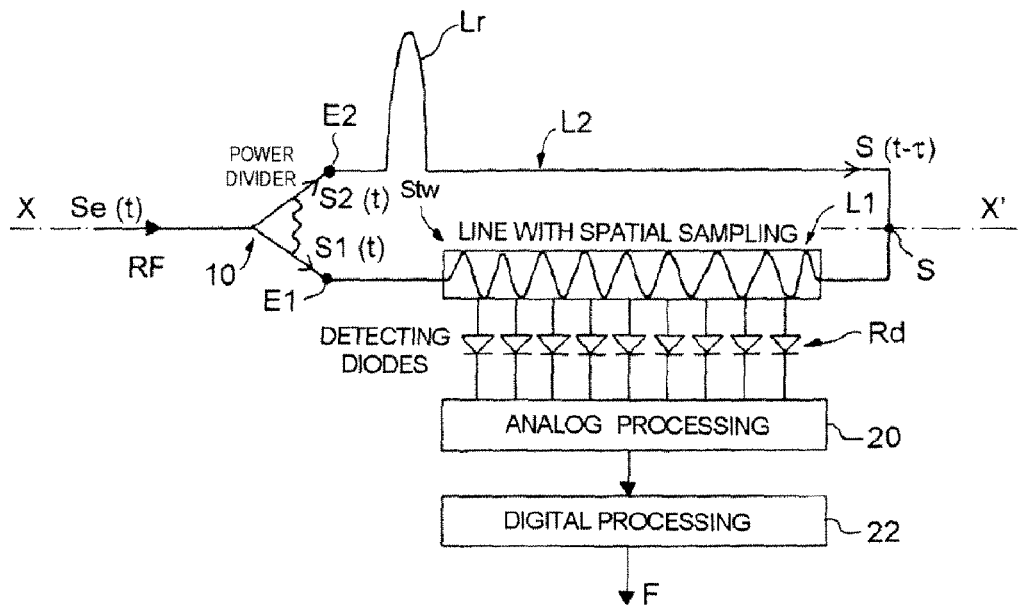
FIG.1, Prior Art
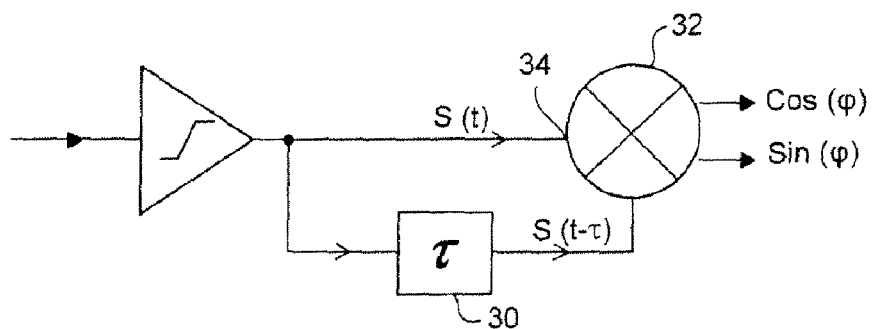
FIG.2, Prior Art

FREQUENCY MEASURING BROADBAND DIGITAL RECEIVER

CROSS-REFERENCE TO RELATED APPLICATIONS

This application is the U.S. national stage application of, and claims priority from, International Application No. PCT/EP2007/050608, filed Jan. 22, 2007, which in turn claims priority from French patent application No. 0601205 filed with the French Patent Office on Feb. 10, 2006, both of which are incorporated herein by reference in their entirety. The International Application was published in French on Aug. 16, 2007 as WO/2007/090730.

BACKGROUND OF THE INVENTION

1. Field of the Invention

The invention relates more precisely to a very broadband receiver intended for instantaneously measuring the frequency of signals received (or intercepted) by the receiver notably in the field of radar frequencies.

2. Description of the Related Art

Receivers intended for detecting radioelectric signals of radar (or telecommunications) type are notably used in the field of electronic warfare. These types of receivers comprise functions for measuring instantaneous frequency and the level of the signal received.

The technical problem which arises for such receivers is that of measuring the frequency of the intercepted signals with:

good sensitivity; the noise power intrinsic to an instantaneous broadband receiver necessitates working with a very low, or even negative, signal-to-noise ratio to obtain the required sensitivity, low duration of measurement, and therefore of integration; the aim being to characterize radar emissions whose pulse duration may be very short, signal measurements intercepted at a high rate; the aim is to associate the measurements of frequency and level so as to characterize the signals intercepted with good temporal resolution, a low-cost and low-volume measurement receiver; a significant improvement in this field makes it possible, for example in detection systems, to multiply the number of receivers per system and therefore to improve the performance of the system without weighing on either the price or the volume of the system.

State of the art receivers operating at very high frequencies generally comprise analog input stages followed by digital signal processing stages.

An operating principle of a state of the art receiver allowing instantaneous measurement of the frequency of the signal received designated by "frequency meter with spatial sampling" is based on the creation of a standing wave regime, on the basis of the signal received, in a propagation line and on measuring the position of the nodes and antinodes distributed along this propagation line, the periodicity of the nodes and antinodes gives a coarse measurement of the frequency of the signal received.

FIG. 1 represents a principle of a state of the art receiver showing a practical way of obtaining this standing wave regime.

A signal received se(t), after analog amplification, is distributed by a power distributor 10 to two outputs of the distributor. Each signal s1(t) and s2(t) at the two outputs of the distributor 10 is applied, one s1(t) to an input E1 of an analog propagation line L1 and the other s2(t) to an input E2 of another analog propagation line L2, the two analog lines being oriented along an axis XX'. The other analog line L2 comprises in series a delay line Lr. The two lines L1 and L2 are connected by their output S.

The signal s1(t) propagates on the line L1 in the increasing direction of x along this axis XX'. Another signal s2(t-τ) obtained on the basis of the signal s2(t) delayed by τ by the delay line Lr is injected by the line L2 at the other end S of the line L1 and propagates on the line L1 in the direction of decreasing x. This results in a standing wave regime Stw along the propagation line L1 producing voltage nodes and antinodes whose periodicity provides a coarse measurement of the frequency F of the signal received by the receiver.

The positions of the nodes and antinodes are detected by a row Rd of detecting diodes disposed along the line L1 whose output signals form the subject of an analog 20 and then digital 22 signal processing providing this coarse frequency measurement F of angular frequency ω.

The position of the nodes and antinodes is expressed by the expression $$g(x) = k \cdot A^2 \cdot \left[1 + \cos\left[\frac{2\omega x}{Vo}\right] + \varphi\right]$$

with $$f = \frac{\varphi}{2\pi \cdot \tau}$$

The position of the nodes and antinodes (therefore the term φ) gives a fine measurement of the frequency, but ambiguous.

g(x) is sampled along the propagation line L1. A discrete Fourier transform makes it possible to extract the coarse frequency measurement and the ambiguous fine measurement. The compromises of precision that are necessary for resolving the ambiguity must be made.

In another operating principle of the state of the art receiver termed "auto-correlator with delay line", the idea is to directly measure the phase difference φ induced by a delay line 30 of delay τ.

FIG. 2 represents this other principle of a state of the art receiver for measuring frequencies of the signal received.

The measurement of phase shift between the signal received s(t) and the signal received delayed by τ s(t-τ) is performed by a mixer of SSB type 32 (single sideband) receiving through a mixing input 34 the signal received s(t) and through another mixing input the signal s(t-τ) delayed by τ. The frequency of the signal $F_{measured}$ is deduced therefrom:

$$Fmeasured = \frac{\varphi}{2\pi \cdot \tau}$$

The phase is measured to within 2π. To obtain a non-ambiguous measurement in a given frequency domain, the line length (delay τ) is limited. On the other hand, for a given phase error, the larger τ, the more precise the frequency measurement. To obtain the required frequency precision without ambiguity, it is necessary to use several delay lines simultaneously. The longest line gives the precision, the other line, or lines, make it possible to resolve the ambiguities.

The state of the art receivers implementing these solutions for measuring the frequency of the signal received comprise drawbacks notably:

significant volume and cost;
use analog functions which are therefore subject to drifting such as:
variations in the delays as a function of temperature,
Imperfections of the level measurements (spatial sampling solution);
imperfections of the phase shift measurements (auto-correlator with delay line solution).

Consequently, it is necessary, in these state of the art solutions, to resort to adjustments and calibrations to compensate for this analog drifting and improve the precision and fidelity of the frequency measurements. This contributes, furthermore, to increasing the cost of these solutions and limiting the precision.

The state of the art solutions are not suitable for extracting the phase modulation of the signal. This is because a phase jump in the incident signal is visible only for a transient of duration corresponding to the propagation time in the delay line. This duration being very low, it is difficult to utilize the item of information.

BRIEF SUMMARY OF THE INVENTION

To alleviate the drawbacks of the state of the art frequency measuring receivers, the invention proposes a microwave receiver configured for measuring the frequency F of the microwave signal received by the receiver, in a band of frequencies whose maximum frequency is Fmax, characterized in that it comprises N frequency measuring digital stages E1, E2, ... Ek, ... EN providing N ambiguous frequency measurements Fm1, Fm2, ... Fmk, ... FmN of the signal received, the signal received being sampled, in each digital stage, at a respective sampling frequency Fe1, Fe2, ... Fek, ... FeN, the receiver comprising furthermore an ambiguity resolving device receiving the N frequency measurements and providing the frequency F of the signal received, and in that each frequency measuring digital stage Ek (k integer number lying between 1 and N) comprises:

a one-bit analog/digital converter fed directly with the microwave signal received by the receiver, each converter providing a real digital signal at a sampling frequency Fek, calculation means for performing a discrete Fourier transform (DFT) on the basis of the samples output by the one-bit converter, at least one detector of spectral line maximum of the discrete Fourier transform provided by the calculation means.

In a preferential embodiment of the receiver, the respective sampling frequencies Fe1, Fe2, ... Fek, ... FeN of the one-bit analog/digital converters of the stages of the receiver are lower than the maximum frequency Fmax of the band of the receiver.

A main objective of this invention is to reduce the cost and volume of the receiver.

Another objective is to be able to obtain superior performance to that of the state of the art receivers at the price of greater complexity.

The principle of the receiver according to the invention is based on digitization of the signal received right from the input of the receiver in the very broad reception band of the receiver. This digitization comprises quantization (discretization of the amplitude of the signal) and sampling (temporal discretization).

In the receiver according to the invention, the frequency is the only item of information processed, the amplitude quantization of the signal received is performed on a single bit, this being equivalent to a phase quantization on two states.

In practice the digitization of the signal received is performed by a D flip-flop whose bandwidth covers at least the microwave band Fmax, this currently being possible with the technologies available on the market.

Another significant aspect of the invention resides in the fact that the digital sampling of the signal received is performed at a much lower frequency than the maximum frequency that can be received by the receiver.

BRIEF DESCRIPTION OF THE DRAWINGS

The invention will be better understood with the aid of exemplary embodiments of frequency measuring receivers according to the invention with reference to the appended figures in which:

FIG. 1, already described, represents a principle of a state of the art receiver for measuring frequencies of the signal received;

FIG. 2, already described, represents another principle of a state of the art receiver for measuring frequencies of the signal received;

DETAILED DESCRIPTION

In digital signal processing, the basic rule is compliance with Shannon's theorem. It would be possible to sample at a frequency compatible with Shannon's theorem but the cost and the bulkiness of the receiver would be greater. Specifically, a very high sampling frequency gives rise to complexity of the interface between the sampling D flip-flop and the digital circuit, as well as very significant volume of the digital processing.

One of the basic ideas of the present invention is to use a sampling frequency of the signal received by the receiver that is markedly lower than that necessary for compliance with Shannon's theorem. This results in ambiguities due to the spectrum aliasing given that to a measured frequency Fmk (or one provided by a frequency measuring stage Ek of the receiver) there corresponds to several possible frequencies F1, F2, ... Fp at the input of the receiver.

Figure 3:
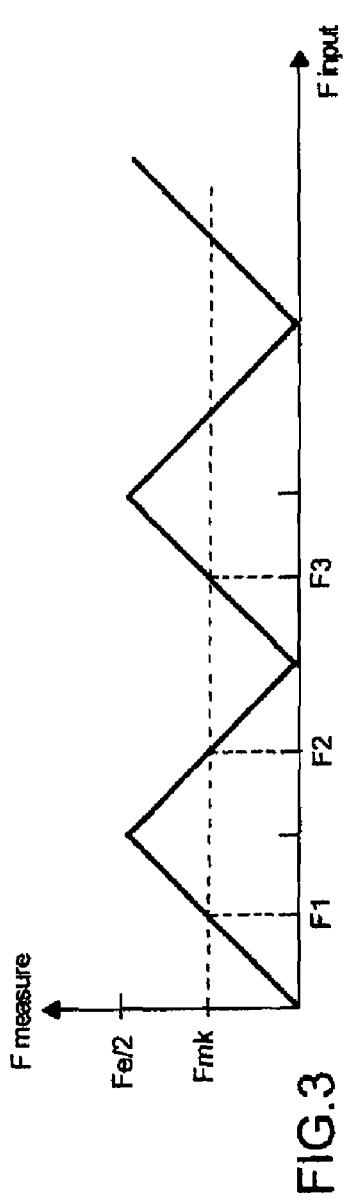
FIG. 3 illustrates the problem of ambiguity of the various possible frequencies at the input of the receiver.

FIG. 3 illustrates this problem of ambiguity of the various possible frequencies F1, F2, ... Fp at the input of the receiver for a measured frequency Fmk.

Figure 4:
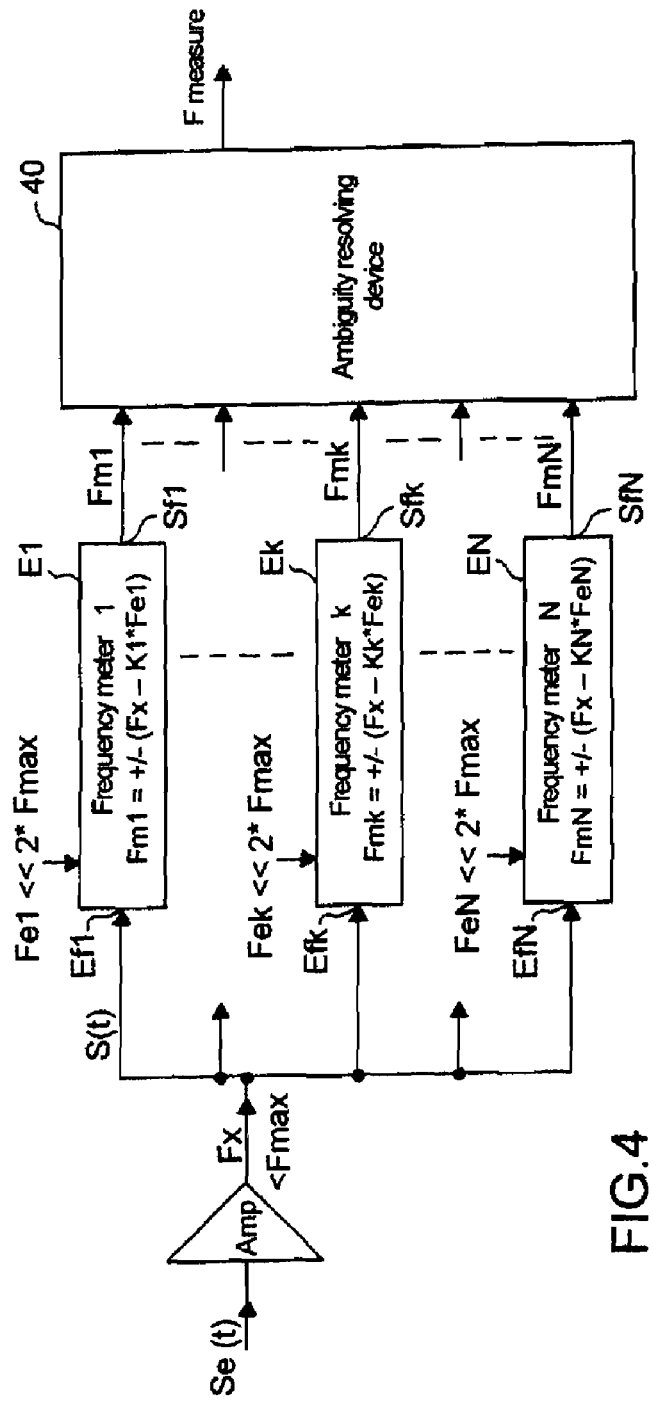
FIG. 4 represents a schematic of a frequency measuring receiver, according to the invention.

FIG. 4 represents a schematic of a receiver for measuring frequency, according to the invention, of the signal received.

The receiver comprises:

a broadband amplifier Amp for adapting the signal se(t) received by the antenna to the frequency measuring digital stages;

N digital stages E1, E2, ... Ek, ... EN for measuring the frequency (or frequency meter) of the signal received s(t) at the output from the amplifier Amp, each stage providing respectively, on the basis of the signal received s(t) applied to an input Efk of the frequency meter, a measurement frequency Fmk (with k index of the frequency measurement pathway, or of the frequency meter, taking the integer values from 1 to N), each stage performing a sampling of the signal s(t) applied its input Efk at a respective sampling frequency Fe1, Fe2, . . . Fek, . . . FeN;

a device 40 for resolving the ambiguities in the frequencies Fmk measured by the various frequency measuring digital stages E1, E2, . . . Ek, . . . EN providing a true value Fmeasure of the frequency of the signal received by the receiver.

Each of the frequency meters E1, E2, . . . Ek, . . . EN provides a respective output Sfk with a frequency measurement Fmk expressed by:

for frequency meter E1, Fm1=+/−(Fx−K1*Fe1)
for frequency meter Ek, Fmk=+/−(Fx−Kk*Fek)
for frequency meter EN, FmN=+/−(Fx−KN*FeN)

The apparently more complex system, on account of the use of several frequency meters in parallel, instead of just one, plus a device for resolving the frequency ambiguity, is of a simpler realization.

As a first approximation, if it is considered that the processing volume is proportional to the product of the sampling frequency (Fek) and the number of points of the processing Nptk, and if the integration time Ti is kept constant, Ti=Npts/Fek, a processing volume is obtained which increases with the square of the sampling frequency.

In an exemplary embodiment of the receiver according to the invention, the sampling frequency of each frequency meter can be 10 to 20 times lower than that necessary for compliance with Shannon's theorem for sampling at the maximum frequency Fmax. In this configuration according to the invention, the realization of an ambiguous frequency measurement pathway Ek will require 100 to 400 times less logic resource. A few parallel measurement pathways (E1, E2, . . . Ek, . . . EN) and ambiguity resolution suffice to obtain a non-ambiguous frequency measurement.

On the other hand, the sensitivity of the receiver increases with the sampling frequency Fek. Specifically the microwave noise power folds back entirely in the frequency band lying between 0 and Fek/2 and the noise band is as 1/Ti=constant. Therefore, the noise power at the level of the measurement is as 2/(Ti.Fek). For example a doubling of the sampling frequency Fek gives rise to a sensitivity gain of 3 dB.

In the receiver according to the invention, a compromise is made allowing the same sensitivity as the state of the art solutions with a single FPGA i.e. "Field Programmable Gate Array", of recent technology (90 nm). The constant progress in FPGA technology allows progress in the performance of the frequency measuring receiver according to the invention at constant cost.

Figure 5:
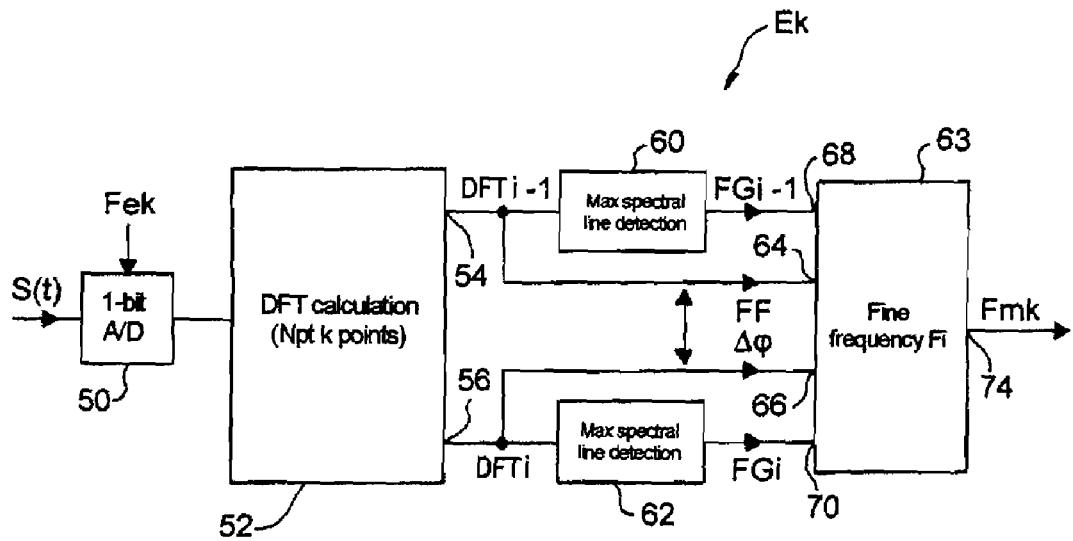
FIG. 5 shows a schematic of a digital frequency meter Ek of the receiver.

FIG. 5 shows a schematic of a digital frequency meter Ek (of index k) of the receiver for measuring frequencies according to the invention.

Each frequency meter Ek comprises a 1-bit analog/digital converter 50 providing Nptk sampling points to a device 52 for calculating the discrete Fourier transform (DFT) on the basis of the sampling points.

The device for calculating the DFT performs the discrete Fourier transform on Nptk points continuously with a temporal overlap of 50%, the device providing a first output 54 with a first discrete Fourier transform DFTi-1 of the Nptk sampling points during a first sampling time period Tei-1 and a second output 56 with a second discrete Fourier transform DFTi of the Nptk sampling points during a second sampling time period Tei overlapping with the first over 50% of the sampling time of the Nptk points (i being the temporal index of the discrete Fourier transforms, or DFTs).

Figure 6:
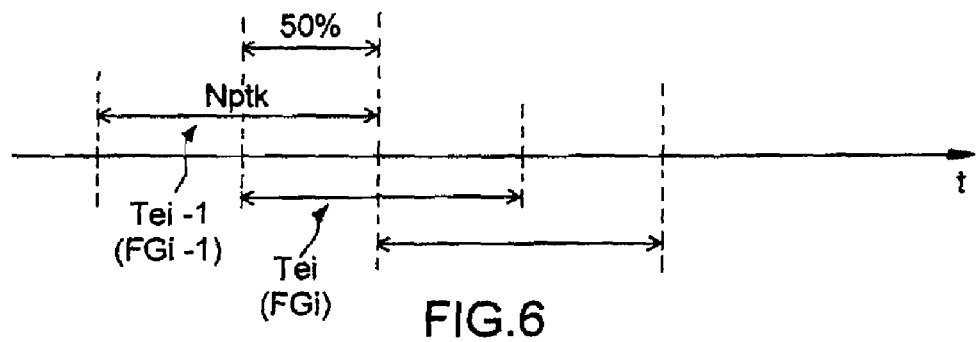
FIG. 6 shows a representation over time of the Fourier transforms DFTi-1 and DFTi of the frequency meter Ek.

FIG. 6 shows a representation over time t of the Fourier transforms DFTi-1 and DFTi during periods i-1 and i of the frequency meter overlapping over 50% of their time.

Each output 54, 56 of the calculation device DFT is fed to a respective peak detector 60, 62 for detecting the maximum spectral line of each of the discrete Fourier transforms DFTi-1 and DFTi, each peak detector providing a respective measurement of coarse frequencies FGi-1 and FGi whose resolution is Fek/Nptk. The measurements are emitted with a recurrence of Nptk/(2.Fek).

The precision obtained at this juncture is directly inverse to the integration time Ti, the latter being insufficient with respect to the precision required, and a second processing is added. The subsequent processing uses the result of two discrete Fourier transforms, of temporal index i-1 and i to provide a frequency Fi of index i termed the fine frequency Fi.

For this purpose the frequency meter Ek of rank k comprises a measurement device 63 for the frequency Fmk receiving, on the one hand, through two inputs 64 and 66 the two results of the two discrete Fourier transforms DFTi-1 and DFTi (of temporal indices i-1 and i), for the calculation of a frequency Fi referred to as fine but exhibiting an ambiguity and, on the other hand, through two other inputs 68, 70, the respective coarse frequency measurements FGi-1 and FGi output by the respective peak detectors 60, 62 so as to resolve the ambiguity in the fine frequency Fi and provide an output 74 of the frequency measurement device 63 with the measurement frequency Fmk of the frequency meter of rank k.

The two discrete Fourier transforms output by the calculations device DFT 52 pertain to integration supports shifted by a delay $\tau$=Nptk/(2.Fek); they therefore exhibit a phase difference $\phi$ such that:

$$\phi = 2.\pi.F.\tau$$

This phase difference $\phi$ provides the fine frequency measurement Fi which is ambiguous and whose ambiguity is resolved by the coarse frequency measurement FGi-1 and FGi.

To summarize, at the output of each frequency meter Ek there is a so-called coarse frequency (the frequency Fmk is obtained by a frequency refinement device which utilizes the phase difference between 2 consecutive Fourier transforms with temporal overlap).

In the receiver for measuring frequencies, according to the invention, the sampling frequencies Fek are different on each pathway (or each frequency meter). In a first variant of the receiver the calculations of the pathways 1, 2, . . . k, . . . N are synchronized to one and the same frequency right from the input of the receiver.

In another variant of the receiver according to the invention, the synchronization of the calculations is performed at the output of the DFT calculation device 52 for this purpose, it is necessary to comply with the relation:

$$\frac{Nptk}{Fek} = Cte,$$

Cte being a constant this relation must be complied with so that the integrations on each pathway pertain to the same temporal slice without slippage.

Knowing that the sampling frequencies Fek must be close, the constraint:

$$\frac{Nptk}{Fek} = Cte$$

leads to carrying out discrete Fourier transforms on numbers of points not as $2^n$. A solution is to supplement the temporal samples with zeros to reach the power of 2 above. This makes it possible to use a conventional fast Fourier transform algorithm (or FFT).

It is also possible to search for values of Nptk which decompose into prime factors that are not too high. A factorization of the calculation of the fast Fourier transform (FFT) into corresponding prime radixes is then carried out.

In a method of calculating the DFT of the receiver according to the invention, the calculation can be performed on an arbitrary number of sampling points (including a prime number) with a lower logic volume than the previous solutions. In this embodiment the expression for the DFT is:

$$[X_N(k)] = \sum_{n=0}^{N-1} [x(n).W_N^{kn}]$$

with $$.W_N^{kn} = e^{-j2\pi\left(\frac{nk}{N}\right)}$$

the idea is to replace the multiplications:

$$[x(n).W_N^{kn}]$$

with an elementary logic operation. For this purpose, the roots of unity $W_N^{kn}$ which moves over a unit circle 80 are replaced with the closest points among the points indicated on a square of roots the unit $W_N^{kn}$ such as represented in FIG. 7.

Figure 7:
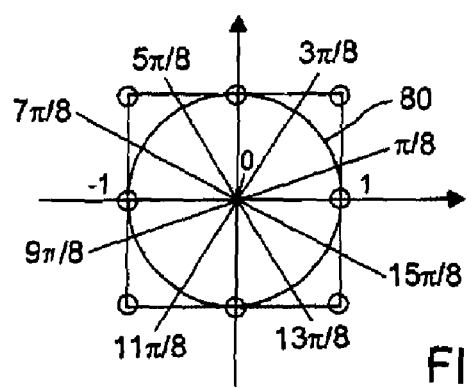
FIG. 7 represents the roots of unity $W_N^{kn}$.

The square of FIG. 7 is centered on two perpendicular axes X and Y. The points of the square are given by all the values that can be taken between −1, 0, 1 on the two axes X and Y.

Knowing that the temporal signal denoted here x(n) is itself coded on a single bit, only addition remains as logic volume for each spectral line.

The receiver comprises the device 40 for resolving the ambiguities in the frequencies measured Fm1, Fm2, . . . Fmk, . . . FmN by the various measurement stages E1, E2, . . . Ek, . . . EN providing a true value Fmeasure of the frequency of the signal received by the receiver.

For an ambiguous measurement on a frequency measurement pathway there are several possible frequencies F1, F2, F3, . . . Fp at the input of the receiver (see FIG. 3). The number of possibilities is dependent on the sub-sampling rate with respect to Shannon's criterion.

The invention also relates to methods for resolving the ambiguities in the frequencies measured by the frequency meters of the receiver according to the invention.

At large signal-to-noise ratio and with a judicious choice of the Fek, three measurement pathways (or frequency meters) are sufficient to resolve the ambiguities.

Resolution of the ambiguity in the frequency consists in searching for the candidates (the possible frequencies F1, F2, F3, . . . Fp, see FIG. 3) which exhibit a deviation between pathways that is below a decision threshold Sd. A possible scheme for implementing the method for resolving ambiguity comprises the following steps:

For each pathway Ek (or receiver Ek), calculation of all the possible frequencies (F1k, F2k, F3k, . . . Fpk) on the basis of the frequency Fmk, (such as represented in FIG. 3). One limits oneself to the domain of frequencies to be processed.

Then one pathway Er, from among all the pathways E1, E2, . . . Er, . . . Ek, . . . Ex, . . . Ey, . . . EN of the receiver, is taken as reference, and for each possible frequency (F1r, F2r, F3r, . . . Fpr) of this reference pathway Er, the following is performed:

the search on two other pathways Ex, Ey of the receiver, for the possible frequency (F1x, F2x, F3x, . . . Fpx) of the pathway Ex and, for the possible frequency (F1y, F2y, F3y, . . . Fpy) of the pathway Ey that are the closest, to each of the frequencies (F1r, F2r, F3r, . . . Fpr) of the reference pathway Er, then the following is performed:

a calculation of the various deviations between the closest frequencies of the pathways Ex, Ey with respect to the frequencies (F1r, F2r, F3r, . . . Fpr) of the reference pathway Er, a test of the deviations with respect to the decision threshold Sd, If a case of consistency is found, determined by deviations that are below the threshold Sd, the ambiguity is considered resolved. To improve the standard deviation of the measurement error it is possible to calculate the mean between the 3 possible frequencies retained (one per pathway)

If the deviations are above the decision threshold, there is considered to be no consistency and this measurement is rejected.

The aim is to provide only good (or true) measurements of the frequency of the signal received by the receiver. Ambiguity resolution will be carried out by putting in place criteria for rejecting frequency measurements notably in the event of too low a signal-to-noise ratio or in the event of disturbing signals.

In a first level of rejecting the frequency measurements, a first rejection criterion is put in place at the level of the frequency meters of the receiver: the consistency between the two consecutive coarse frequencies FGi-1 and FGi of the frequency meters (see FIG. 5) is examined, if the deviation is greater than a spectral line (a deviation of a spectral line corresponds to the spectral resolution at the output of the DFT), the measurement is rejected.

Cases of unrejected false measurement may remain, such as:

cases of the noise peaks which fall on one and the same spectral line, to + or − a spectral line, on two consecutive DFTs;

case of a disturbing signal of lower power, if the signal to be measured is close to a multiple of Fe/2.

In a second level of rejecting the measurements, to improve the robustness of the measurement, a fourth pathway E4 is added to the other three pathways of the receiver E1, E2, E3, (N=4), a rejection algorithm takes into account the fact that a pathway may be false. The principle is not to favor one pathway more than another. Each pathway has the same importance. This is why the consistency between the pathways is tested in the following four typical cases.

case 1: by removing pathway E1 and by using pathways E2, E3 and E4 case 2: by removing pathway E2 and by using pathways E1 ,E3 and E4 case 3: by removing pathway E3 and by using pathways E1, E2 and E4 case 4: by removing pathway E4 and by using pathways E1, E2 and E3

In each of the above cases, the reference pathway used to calculate the deviations can be any one of the 3 pathways used, but cannot be the deleted pathway. To explore the 4 cases above, this leads to calculating the deviations in 5 configurations which may be for example:

deviations 1.4: calculation of the deviations of pathway E1 with respect to pathway E4 as reference deviations 2.4: calculation of the deviations of pathway E2 with respect to pathway E4 as reference deviations 3.4: calculation of the deviations of pathway E2 with respect to pathway E4 as reference deviations 1.3: calculation of the deviations of pathway E1 with respect to pathway E3 as reference deviations 2.3: calculation of the deviations of pathway E2 with respect to pathway E3 as reference In this example the 4 cases are obtained in the following manner:

Case 1 (without pathway E1): deviations 2.4 and deviations 3.4

Case 2 (without pathway E2): deviations 1.4 and deviations 3.4

Case 3 (without pathway E3): deviations 1.4 and deviations 2.4

Case 4 (without pathway E4): deviations 1.3 and deviations 2.3

Thereafter the results obtained are compared:

Firstly an examination is conducted to determine whether a consistency exists in all 4 cases. If so this signifies that the four pathways are correct. To improve the standard deviation of the final measurement error, it is possible to calculate the mean between the 4 frequencies (one per case). Otherwise, an examination is conducted to determine whether a consistency exists in a single case. If so this signifies that a pathway is false, and the frequency retained is that arising from this case. Otherwise, that is to say if there is consistency in 3 cases, 2 cases or no case, the measurement is rejected.

In the case where a single pathway is false, the algorithm resists and 100% of the measurements are valid.

In the case where 2 or more pathways are false, generally the algorithm does not find any consistency and the measurement is rejected. Possible cases of errors remain, of extremely low probability, if false measurements reveal a consistency in the wrong spot.

In a system for measuring frequency of a signal received comprising several receivers according to the invention, the system furthermore providing a level of the signal received, a third level of rejecting the measured frequencies can be put in place. The level measurements and the frequencies provided by the various receivers of the system are grouped together and correlated so as to detect the frequency of the signal received. These measurements are provided at the same rate and are synchronized.

At this level are performed:

the rejection of all the frequencies if the level received is under a detection threshold.

the rejection of a frequency if it departs from a cluster of consistent points during a pulse of signal received.

The aim is to integrate this information so as to formulate a pulse descriptor which comprises inter alia:

a single level;

a single frequency plus optionally the information regarding modulation in the pulse.

One of the significant characteristics of the frequency measuring receiver according to the invention is that it comprises one more pathway than the number of pathways that are necessary for resolving the ambiguity in the frequencies and that the algorithm used for this ambiguity resolution takes into account the fact that a pathway may give false frequencies.

The main aim of the embodiment described of the frequency measuring receiver according to the invention is to measure the frequency of the most powerful signal present in the signal received by the receiver. Despite the coding on one bit, the principle of the proposed receiver has the potential to detect the presence and measure the frequency of a second signal present simultaneously. For this purpose the elementary frequency meters can provide several detections (in the embodiment described only the strongest spectral line is provided), and the ambiguity resolution can be made more complex in order to extract two frequencies.

The invention claimed is:

1. A microwave receiver configured to measure a frequency F of a microwave signal received by the receiver, in a band of frequencies having a maximum frequency Fmax, the receiver comprising:

N frequency meters E1, E2, . . . Ek, . . . EN, each meter forming at least a portion of N pathways respectively to provide respectively N ambiguous frequency measurements Fm1, Fm2, . . . Fmk, . . . FmN of the microwave signal received, the microwave signal received being sampled, in each frequency meter, at a respective sampling frequency Fe1, Fe2, . . . Fek, . . . FeN, each frequency meter comprising:

a one-bit analog/digital converter fed directly with the microwave signal received by the receiver, each converter providing a real digital signal at a sampling frequency Fek;

a DFT processor to perform a discrete Fourier transform based on the real digital signal output by the one-bit converter; and at least one peak detector of a spectral line maximum of the discrete Fourier transform provided by the DFT processor; and the receiver further comprising, an ambiguity resolving device receiving the N frequency measurements and providing the frequency F of the microwave signal received, wherein the N frequency meters provide Nptk sampling points to the DFT processor, wherein the DFT processor further comprises:

a first output to provide a result of a first discrete Fourier transform DFTi-1 of the Nptk sampling points during a first sampling time period; and a second output to provide a result of a second discrete Fourier transform DFTi of the Nptk sampling points during a second sampling time period, wherein the second sampling time period temporally overlaps the first sampling time period by approximately 50%.

2. The microwave receiver as claimed in claim 1, wherein the sampling frequencies Fe1, Fe2, . . . Fek, . . . FeN of the one-bit analog/digital converters of the frequency meters of the receiver are lower than the maximum frequency Fmax of the band of frequencies of the receiver.

3. The microwave receiver as claimed in claim 1, wherein the one-bit analog/digital converter performs a phase quantization on two states.

4. The microwave receiver as claimed in claim 1, wherein the digitization of the microwave signal is performed by a D flip-flop having a bandwidth that covers at least the band of frequencies having the maximum frequency Fmax.

5. The microwave receiver as claimed in claim 1, further comprising:
   a broadband amplifier to amplify a signal se(t) received by an antenna, to produce a signal s(t) applied to the N frequency meters E1, E2, ... Ek, ... EN at respective inputs Efk;
   a device to resolve ambiguities in the frequencies Fmk measured by the N frequency meters E1, E2, ... Ek, ... EN to provide a frequency measurement of the microwave signal received by the receiver.

6. The microwave receiver as claimed in claim 5, wherein each of the N frequency meters E1, E2, ... Ek, ... EN provide, at a respective output Sfk, a frequency measurement Fmk determined in accordance with the following relationship:

Fmk=+/−(Fx−Kk*Fek).

7. The microwave receiver as claimed in claim 1, wherein the sampling frequency Fe1, Fe2, ... Fek, ... FeN of each respective frequency meter is lower than a Shannon limit for sampling at the maximum frequency Fmax.

8. The microwave receiver as claimed in claim 1, wherein the first and second outputs of the DFT processor are fed to the at least one peak detector to detect the maximum spectral line of each of the discrete Fourier transforms DFTi-1 and DFTi, the at least one peak detector respectively providing coarse frequency measurements FGi-1 and FGi having a resolution Fek/Nptk, the coarse frequency measurements provided with a recurrence of Nptk/(2.Fek).

9. The microwave receiver as claimed in claim 8, wherein each frequency meter further comprises a frequency measurement device, the frequency measurement device comprising:
   first and second inputs to receive respectively the two results of the two discrete Fourier transforms DFTi-1 and DFTi, to calculate a fine frequency Fi; and
   third and fourth inputs to receive respectively the coarse frequency measurements FGi-1 and FGi output by the respective peak detectors; and
   an output to provide the measurement frequency Fmk of the frequency meter,
   wherein the frequency measurement device resolves an ambiguity in the fine frequency Fi by use of the coarse frequency measurements.

10. The microwave receiver as claimed in claim 8, wherein the first and second discrete Fourier transforms output by the DFT processor pertain to integration supports shifted by a delay τ
   wherein τNptk/(2.Fek),
to provide a phase difference φ determined in accordance with the following relationship:

φ=2.π.F.τ wherein the phase difference φ provides a fine frequency measurement Fi having an ambiguity that is resolved by the coarse frequency measurement FGi-1 and FGi.

11. The microwave receiver as claimed in claim 1, wherein the calculations of the N pathways are synchronized to a shared frequency from the input of the receiver.

12. The microwave receiver as claimed in claim 1, wherein a synchronization of the calculations is performed at the output of the DFT processor, and is determined in accordance with the following relationship:

$$\frac{Nptk}{Fek} = Cte,$$

Cte being a constant.

13. A method for calculating the DFT of a receiver for measuring frequencies as claimed in claim 1, wherein the method is performed on an arbitrary number of sampling points including a prime number, and the expression for the DFT is determined in accordance with the following relationship:

$$[X_N(k)] = \sum_{n=0}^{N-1} [x(n).W_N^{kn}]$$

with $$.W_N^{kn} = e^{-j2\pi\left(\frac{nk}{N}\right)}$$

wherein the multiplications; $[x(n).W_N^{kn}]$
are accomplished by at elementary logic operation.

14. The method for calculating the DFT as claimed in claim 13, wherein one or more roots of unity $W_N^{kn}$ which move over a unit circle are replaced with the closest points among the points indicated on a unit square circumscribing the unit circle.

15. A method for resolving the ambiguities in the frequencies measured by the frequency meters as claimed in claim 1, further comprising the step of searching for possible frequencies F1, F2, F3, ... Fp which exhibit a deviation that is below a decision threshold Sd, wherein the deviation is a difference between a pair of possible frequencies.

16. The method for resolving the ambiguities as claimed in claim 15, further comprising the steps of:
   calculating, for each pathway, possible frequencies (F1k, F2k, F3k, ... Fpk) based on the frequency Fmk, limited to a domain of frequencies to be processed;
   designating a pathway Er of the receiver as a reference, and repeating for each possible frequency (F1r, F2r, F3r, ... Fpr) of the reference pathway Er, the following steps of:
      searching in a first pathway Ex for the possible frequencies (F1x, F2x, F3x, ... Fpx) that are closest to each of the frequencies (F1r, F2r, F3r, ... Epr) of the reference pathway Er, to produce closest frequencies of the pathway Ex;
      searching in a second pathway Ey for the possible frequencies (F1y, F2y, F3y, ... Fpy) that are closest to each of the frequencies (F1r, F2r, F3r, ... Epr) of the reference pathway Er, to produce closest frequencies of the pathway Ey;
      calculating deviations between the closest frequencies of the pathways Ex, Ey with respect to the frequencies (F1r, F2r, F3r, ... Fpr) of the reference pathway Er; and
      testing the deviations with respect to the decision threshold Sd;
   wherein:
      if the deviations are below the decision threshold Sd, then consistency is found and the ambiguity is considered resolved; and
      if the deviations are above the decision threshold Sd, then consistency is not found and the measurement is rejected.

17. The method for resolving the ambiguities as claimed in claim 16, further comprising the step of calculating the mean between the 3 possible frequencies retained, one per pathway, in order to improve the standard deviation of the measurement error.

18. The method for resolving the ambiguities as claimed in claim 15, further comprising the step of putting in place criteria for rejecting frequency measurements.

19. The method for resolving the ambiguities as claimed in claim 18, further comprising the steps of:
   examining a deviation between the two consecutive coarse frequencies FGi-1 and FGi of the frequency meters;
   rejecting the measurement if the deviation is greater than a spectral line, wherein a deviation of a spectral line corresponds to the spectral resolution at the output of the DFT.

20. The method for resolving the ambiguities as claimed in claim 18, wherein the receiver has at least four pathways E1, E2, E3 and E4 for measuring frequencies the deviation between the pathways is tested in a first, second, third, and fourth case, wherein:
   the first case includes testing a first deviation between pathways E2, E3 and E4;
   the second case includes testing a second deviation between pathways E1, E3 and E4;
   the third case includes testing a third deviation between pathways E1, E2 and E4; and
   the fourth case includes testing a fourth deviation between pathways E1, E2 and E3,
   and wherein a reference pathway used to calculate the first, second, third, and fourth deviation is any one of the three pathways used in the respective deviation testing.

21. The method for resolving the ambiguities as claimed in claim 20, further comprising the steps of:
   calculating deviations in a first, second, third, fourth and fifth configuration for a first, second, third and fourth case, to produce calculated deviations;
   comparing the calculated deviations obtained to determine whether a consistency exists among the first, second, third and fourth cases together, wherein if the consistency exists among the first, second, third and fourth cases together then the four pathways E1, E2, E3 and E4 are correct;
   if no consistency exists among the first, second, third and fourth cases together, examining whether a consistency exists among the first, second, third and fourth cases in a single case, to identify a consistent case, wherein if the consistent case exists then a pathway is false and a frequency of the consistent case is retained; and
   rejecting the measurement if there is consistency in three cases, two cases or no case, wherein:
   the first configuration includes calculation of the deviation of pathway E1 with respect to pathway E4 as reference;
   the second configuration includes calculation of the deviation of pathway E2 with respect to pathway E4 as reference;
   the third configuration includes calculation of the deviation of pathway E2 with respect to pathway E4 as reference;
   the fourth configuration includes calculation of the deviation of pathway E1 with respect to pathway E3 as reference;
   the fifth configuration includes calculation of the deviation of pathway E2 with respect to pathway E3 as reference;
   the first case includes the second and third configurations;
   the second case includes the first and third configurations;
   the third case includes the first and second configurations; and
   the fourth case includes the fourth and fifth configurations.

22. The method for resolving the ambiguities as claimed in claim 18, further comprising the steps of:
   correlating the level measurements and the frequencies provided by the receivers so as to detect the frequency of the microwave signal received, wherein the level measurements are provided at the same rate and are synchronized; and
   rejecting all the frequencies if the level received is under a detection threshold.

23. The method for resolving the ambiguities as claimed in claim 22, wherein a frequency is rejected if it departs from a cluster of consistent points during a pulse of the microwave signal received.

* * * * *